United States Patent [19]

Troxell et al.

[11] Patent Number: 5,130,264

[45] Date of Patent: Jul. 14, 1992

[54] METHOD OF MAKING A THIN FILM TRANSISTOR

[75] Inventors: John R. Troxell, Sterling Heights; Marie I. Harrington, Troy, both of Mich.

[73] Assignee: General Motors Corporation, Detroit, Mich.

[21] Appl. No.: 763,485

[22] Filed: Sep. 23, 1991

Related U.S. Application Data

[63] Continuation of Ser. No. 508,158, Apr. 11, 1990, abandoned.

[51] Int. Cl.$^5$ .......................... H01L 21/265
[52] U.S. Cl. .......................... 437/40; 437/62; 437/69; 437/968; 437/983; 437/913; 148/DIG. 150; 148/DIG. 53
[58] Field of Search .................. 437/40, 29, 69, 41

[56] References Cited

U.S. PATENT DOCUMENTS

| | | | |
|---|---|---|---|
| 3,853,633 | 12/1974 | Armstrong | 437/29 |
| 4,136,434 | 1/1979 | Thibault et al. | 437/968 |
| 4,221,044 | 9/1980 | Godejahn, Jr. et al. | 437/983 |
| 4,277,883 | 7/1981 | Kaplan | 148/150 |
| 4,420,870 | 12/1983 | Kimura | 437/29 |
| 4,523,963 | 5/1985 | Ohta et al. | 437/29 |
| 4,651,406 | 3/1987 | Shimizu et al. | 437/43 |
| 4,735,919 | 4/1988 | Faraone | 437/69 |
| 4,851,363 | 7/1989 | Troxell et al. | 437/978 |

FOREIGN PATENT DOCUMENTS

| | | | |
|---|---|---|---|
| 0160965 | 11/1985 | European Pat. Off. | 437/43 |
| 0308316 | 3/1989 | European Pat. Off. | 437/43 |
| 0076688 | 7/1978 | Japan | 437/968 |
| 0093644 | 5/1986 | Japan | 437/43 |
| 0065274 | 3/1990 | Japan | 357/23.7 |
| 2062959 | 5/1981 | United Kingdom | 437/193 |

OTHER PUBLICATIONS

A Monolithic I.C. Fabricated in Laser-Annealed Polysilicon; IEEE; Kamins et al.; vol. ED-27, No. 1, Jan. 1980; 290–293.
A High Voltage MOSFET in Polycrystalline Si.; IEEE; Mohammadi et al., vol. ED. 27; No. 1; Jan. 1980; 293.
Appels et al., "Local Oxidation of Silicon and its Application in Semiconductor-Device Technology", Philips Res. Repts 25, 118–132, 1970.
Marcus et al., "The Oxidation of Shaped Silicon Surfaces", Journal of the Electrochemical Society, Solid-State Science and Technology, 1278–1282, Jun. 1982.
Marcus et al., "Polysilicon/SiO$_2$ Interface Microtexture and Dielectric Breakdown", Journal of the Electrochemical Society, Solid-State Science and Technology, 1282–1289, Jun. 1982.
Ham et al., "The Study of Microcircuits by Transmission Electron Microscopy", RCA Review, vol. 38, 351–389, Sep. 1977.

(List continued on next page.)

Primary Examiner—Brian E. Hearn
Assistant Examiner—Michael Trinh
Attorney, Agent, or Firm—Cary W. Brooks

[57] ABSTRACT

A thin film field effect transistor has an island of polysilicon on the surface of a substrate, preferably of an insulating material. A layer of silicon dioxide is on the surface of the substrate and surrounds the polysilicon island. The silicon dioxide layer is of substantially uniform thickness and contacts the edge of the polysilicon island. A gate insulator layer, preferably of silicon dioxide, of substantially uniform thickness is on the surface of the polysilicon island. A conductive gate, preferably of doped polysilicon, is on the gate insulator layer and extends across a portion of the polysilicon island. The portions of the polysilicon island at opposite sides of the gate are doped to form the source and drain of the transistor. The transistor is formed by applying a layer of polysilicon on the surface of a substrate and applying a mask over the portion of the polysilicon layer which is to form the island. The uncovered portion of the polysilicon layer is converted to silicon dioxide, such as by heating in an atmosphere containing oxygen. After removing the mask, the gate insulator layer is formed over the surface of the polysilicon island, and the gate is formed over the gate insulator.

12 Claims, 6 Drawing Sheets

OTHER PUBLICATIONS

Irene et al., "Silicon Oxidation Studies: Morphological Aspects of the Oxidation of Polycrystalline Silicon", J. Electrochem. Soc.: Solid-State Science and Technology, vol. 127, No. 3, 705–713, Mar. 1980.

Kamins and MacKenna, "Thermal Oxidation of Polycrystalline Silicon Films", Metallurgical Transactions, vol. 2, 2292–2294, Aug. 1971.

Troxell et al., "Laser-Recrystallized Silicon Thin-Film Transistors on Expansion-Matched 800° C. Glass", IEEE Electron Device Letters, vol. EDL-8, No. 12, 576–578, Dec. 1987.

Troxell et al., 16.7 "Polysilicon Thin-Film Transistors on a Novel 800° Glass Substrate", SID 86 Digest, 298–300, 1986.

Troxell et al., "Polycrystalline Silicon Thin-Film Transistors on a Novel 800° C. Glass Substrate", IEEE Electron Device Letters, vol. EDL-7, No. 11, Nov. 1986.

Troxell et al., "Materials and Processes for Silicon TFT's on Aluminosilicate Glass: An Alternative SOI Technology", Mat. Res. Soc. Symp. Proc., vol. 107, 1988 Materials Research Society, 329–334.

Lewis et al., "Low Temperature Silicon Oxidation Studies", Proceedings of the Fifth International Symposium of Silicon Materials Science and Technology, Semiconductor Silicon 1986, Proceedings vol. 86-4, The Electrochemical Society, Inc., pp. 416–425.

CHANNEL LENGTH = 20 μm

CHANNEL LENGTH = 20 μm

CHANNEL LENGTH = 5 μm

CHANNEL LENGTH = 5 μm

METHOD OF MAKING A THIN FILM TRANSISTOR

This is a continuation of application Ser. No. 07/508,158 filed on Apr. 11, 1990, now abandoned.

FIELD OF THE INVENTION

The present invention relates to thin film field effect transistors and a method of making the same. More particularly, the present invention relates to a thin film field effect transistor having a gate insulation layer of uniform thickness to improve the performance of the transistor and to a method of making the transistor.

BACKGROUND OF THE INVENTION

In general, a thin film field effect transistor comprises an island or area, generally rectangular, of polycrystalline silicon (hereinafter referred to as "polysilicon") having a thin gate insulator layer, generally of silicon dioxide, extending over a portion thereof. A conductive gate layer, generally of doped polysilicon, is over the gate insulator layer. Conductive contacts, generally of a metal, extend over and contact the portions of the polysilicon layer on opposite sides of the gate layer to contact the source and drain of the transistor.

Referring now to FIGS. 1 and 2, there is shown a perspective view (FIG. 1) and cross-sectional view (FIG. 2) through line 2—2 of FIG. 1 of a prior art thin film field effect transistor 10. The thin film field effect transistor 10 comprises a substrate 12 of insulating material, such as silicon dioxide, having thereon an island (area) 14 of polysilicon. The silicon dioxide of the substrate may be a layer on a body of another material, such as a plate of glass or a body of silicon. Extending across a portion of the polysilicon island 14 is a thin gate insulator layer 16 which is typically of silicon dioxide. The gate insulator layer 16 extends across a top surface 18 of the polysilicon island 14 and a pair of opposed side edges 20 thereof. A conductive gate 22, typically of doped polysilicon, is over the gate insulator layer 16. The portions of the polysilicon island 14 at opposite sides of the gate 22 are doped to form a source region 23 and a drain region 25 of the transistor 10. Conductive contacts (electrodes) 24 and 26, generally of a metal, extend over and engage the source region 23 and the drain region 25, respectively, of the transistor 10. A conductive contact (electrode) 28 also extends over and contacts the gate 22.

Referring now to FIGS. 3–6, there are illustrated the steps of a typical method for making the thin film field effect transistor 10. As shown in FIG. 3, a layer 30 of polysilicon is first deposited on the substrate 12. A mask 32 of a material which is not attacked by an etchant for polysilicon, such as photoresist, is then formed over the area of the polysilicon layer 30 which is to form the island 14 using standard photolithographic techniques. As shown in FIG. 4, the exposed area of the polysilicon layer 30 is then removed using a suitable etching technique, such as plasma etching, to leave the polysilicon island 14. The mask 32 could be made of silicon dioxide and a chemical etch could be used. As shown in FIG. 5, the silicon dioxide gate layer 16 is then formed on the top surface 18 and edges 20 of the island 14 by heating the polysilicon island 14 in an oxygen atmosphere at a temperature at which the polysilicon is oxidized to form the silicon dioxide layer on the island 14. As shown in FIG. 6, a gate layer 22 of doped polysilicon is then deposited on the gate insulator layer 16.

A problem with the thin film field effect transistor 10 which results from the above-described method of making it, is that the gate insulator layer is not of uniform thickness. As shown more clearly in FIG. 2, the gate insulator layer 16 becomes significantly thinner as it extends over the edges 20 of the polysilicon island 14. In addition, stress-induced inhibition of the thermal oxidation process may result in thin oxide regions along the top edges of the polysilicon. Because the electric field in an insulator, such as the gate insulator 14, is inversely proportional to insulator thickness, the fields in such a thinned region are substantially higher than the average field in the gate insulator 14. As a result, insulation breakdown always occurs prematurely in these thinned regions. In addition, other effects related to the strength of the electric field will be enhanced, including the field aided injection of charge into the insulator, an effect to which a variety of transistor failure and performance degradation problems have been attributed. These problems are generally referred to as "hot-electron effects".

It is desirable to have a thin film field effect transistor whose gate insulator is of essentially uniform thickness and a method of making such a transistor.

SUMMARY OF THE INVENTION

Viewed from one aspect, the present invention is directed to a thin film field effect transistor comprising an island of polysilicon on a substrate, a layer of an insulating material of substantially uniform thickness on the island forming the gate insulator, and a conductive gate layer over the insulating layer. By an insulating layer of "substantially uniform thickness," it is meant that the insulating layer does not get thinner at the edges of the island, although the insulating layer can be slightly thicker at the edges of the island. The gate insulator of uniform thickness improves the operating characteristics of the transistor. More particularly, the thin film field effect transistor comprises an island of polysilicon on a substrate, a layer of insulating material on the substrate surrounding the island and contacting the edges of the island, a gate insulator layer of uniform thickness over the top surface of the island, and a conductive gate over the insulator layer. The transistor is made by first forming a layer of polysilicon on a surface of a substrate. A mask is then formed on the area of the polysilicon layer which is to form the transistor island. The exposed area of the polysilicon around the mask is then oxidized to form a silicon oxide layer around the island. Then an insulator layer of uniform thickness is formed over the top surface of the island to serve as the gate insulator.

Viewed from another aspect, the invention is directed to a thin film field effect transistor comprising a substrate having a surface, an island of a layer of polysilicon, first and second insulator layers and a conductive gate region. The island has a bottom surface lying on the surface of the substrate and has a top surface. The first insulator layer is on the surface of the substrate surface and surrounds the island of polysilicon. The second insulator layer has a bottom surface extending across a portion of the top surface of the island, has a top surface, and is substantially uniform in thickness. Spaced-apart portions of the semiconductor material are doped so as to serve as source and drain regions with the portion of the polysilicon therebetween serving as a channel region of the transistor. The conductive gate region is on the top surface of the second insulator layer and extends across a portion thereof and between the drain and source regions.

The invention will be better understood from the following more detailed description taken with the accompanying drawings and claims.

It should be understood that the drawings are not necessarily to scale.

DETAILED DESCRIPTION

Figure 8:
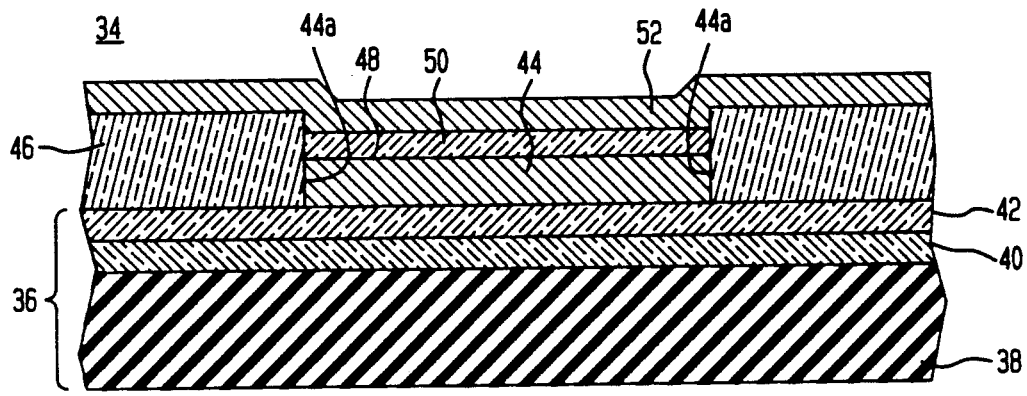
FIG. 8 is a sectional view taken along line 8—8 of FIG. 7.
Figure 9:
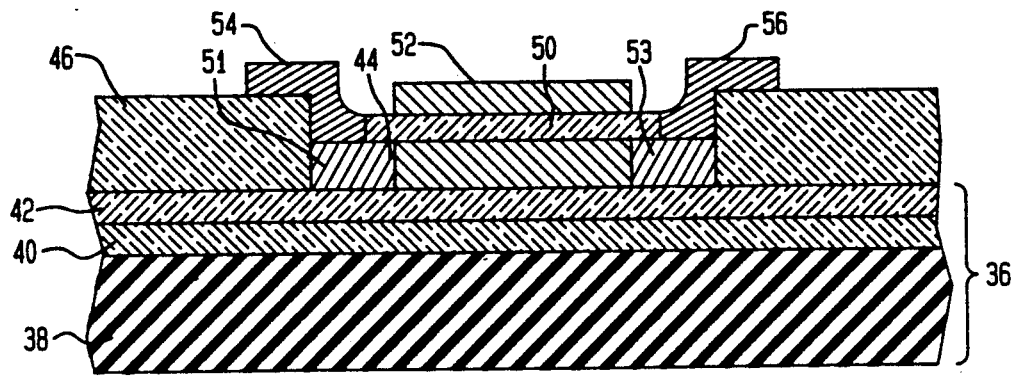
FIG. 9 is a sectional view taken along line 9—9 of FIG. 7.
Figure 3:
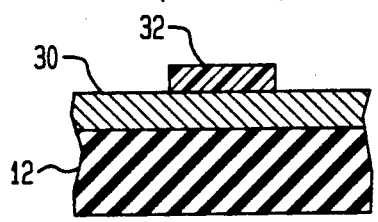
FIGS. 3-6 are sectional views illustrating the various prior art steps of making the transistor shown in FIG. 1.
Figure 7:
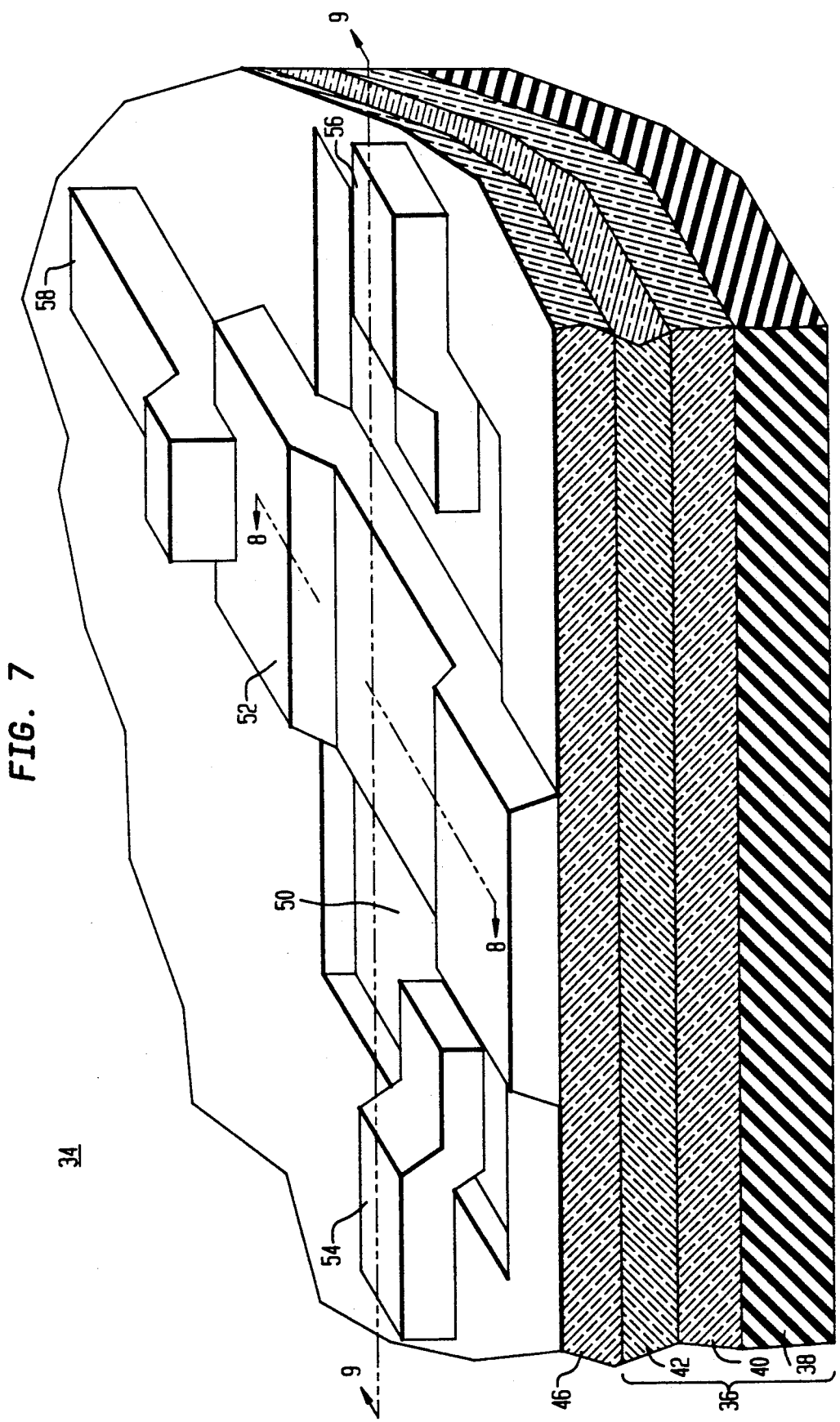
FIG. 7 is a perspective view of a thin film field effect transistor in accordance with the present invention.

Referring now to FIGS. 7-9, there is shown a thin film field effect transistor 34 in accordance with the present invention. FIG. 7 shows a perspective view of transistor 34; FIG. 8 shows a cross-sectional view of transistor 34 through line 8—8 of FIG. 7; and FIG. 9 shows a cross-sectional view of the transistor 34 through line 9—9 of FIG. 7. The thin film field effect transistor 34 is formed on a substrate 36 of an insulating material. As shown, the substrate 36 comprises a glass plate 38 having a thin encapsulation layer 40 (e.g., a silicon nitride film about 100 nanometers in thickness) on a surface thereof and a dielectric layer 42 (e.g., a silicon dioxide film about 1000 nanometers in thickness) on the encapsulation layer 40. However, it should be understood that other types of substrates can be used, such as a sapphire plate or a plate of single crystalline silicon having a dielectric layer of silicon dioxide on the surface thereof.

The transistor 34 comprises an island or area 44, generally rectangular in shape, of polysilicon on the dielectric layer 42. The polysilicon island 44 is about 200 nanometers in thickness and of an area depending on the characteristics of the transistor desired. On the dielectric layer 42 and completely surrounding the polysilicon island 44 is an insulating material layer 46 of silicon dioxide. The insulating layer 46 is thicker than the polysilicon island 44 and contacts edges 44a of the island 44. Extending across the top surface 48 of the island 44 is a gate insulator 50, preferably of silicon dioxide about 60 nanometers in thickness. A conductive gate 52 is on and extends across the gate insulator 50 and extends over portions of the insulating layer 46 adjacent the ends of the gate insulator 50. The conductive gate 52 is preferably doped polysilicon about 500 nanometers in thickness. The portions of the polysilicon island 44 at opposite sides of the gate 52 are doped to form the source 51 and drain 53 of the transistor 34. The source 51 and drain 53 may be of either conductivity type depending on the type of transistor being formed. Conductive contacts (electrodes) 54 and 56 are over the portions of the top surface 48 of the polysilicon island 44 at opposite sides of the gate 52 and extend through openings in the gate insulator layer 50 to contact the source 51 and drain 53, respectively, of the transistor 34. The contacts 54 and 56 extend over the insulating layer 46 adjacent the island 44. A conductive contact (electrode) 58 is on the conductive gate 52 at one end thereof and extends over the adjacent portion of the insulating layer 46. The conductive contacts 54, 56 and 58 are preferably a metal, such as aluminum.

Transistor 34 may be denoted as an Insulated Gate Field Effect Transistor (IGFET) and may be an n-channel or p-channel enhancement mode IGFET or a depletion mode IGFET. If the source and drain regions 51 and 53 are of n-type conductivity and the island 44 is of p-type conductivity, then transistor 34 is an n-channel IGFET. If the source and drain regions 51 and 53 are of p-type conductivity and the island 44 is of n-type conductivity, then transistor 34 is a p-channel IGFET.

Figure 10:
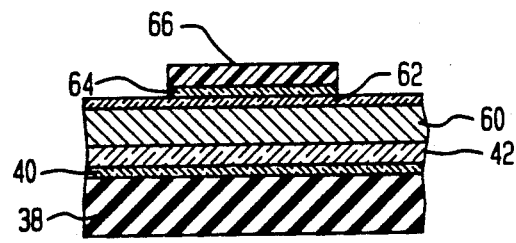
FIGS. 10-13 are sectional views illustrating the various steps of making the transistor shown in FIG. 7.
Figure 4:
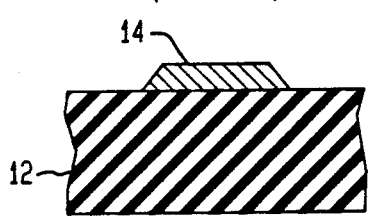

Referring now to FIGS. 10-13, there are shown various steps of making the thin film field effect transistor 34. The thin film field effect transistor 34 can be made by first cleaning the surface of the glass plate 38 by scrubbing and chemical attack. As shown in FIG. 10, the encapsulation layer 40 of silicon nitride is then deposited on the cleaned surface of the glass plate 38 by low pressure chemical vapor deposition wherein the plate 38 is exposed to a gas containing silicon and nitrogen, such as a mixture of silane and ammonia vapors, and heated to a temperature, about 785° C., at which the gases decompose and form the silicon nitride which deposits on the glass surface. The silicon dioxide dielectric layer 42 is then deposited on the encapsulation layer 40. This is also done by low pressure chemical vapor deposition wherein the encapsulation layer 40 is exposed to a gas containing silicon and oxygen, such as silane and oxygen, and is heated to a temperature, about 420° C., at which the gases decompose and form the silicon dioxide which deposits on the encapsulation layer 40.

As shown in FIG. 10, a layer 60 of polysilicon is then deposited on the dielectric layer 42 by low pressure chemical vapor deposition. This is achieved by exposing the dielectric layer 42 to a gas containing silicon, such as silane, and heating the gas to a temperature, about 625° C., to decompose the gas and deposit polycrystalline silicon on the dielectric layer 42. However, instead of depositing a polycrystalline silicon layer on the dielectric layer, a layer of amorphous silicon can be deposited at lower temperatures and then converted to polycrystalline during later heating operations. A thin layer of silicon dioxide 62, about 20 nanometers in thickness, is formed on the polysilicon layer 60. This may be achieved by thermal oxidation wherein the polysilicon layer 60 is heated in an oxidizing atmosphere, such as water vapor, at a temperature of about 800° C., so as to oxidize the surface of the polysilicon layer 60. A layer 64 of silicon nitride about 100 nanometers in thickness is then deposited over the silicon dioxide layer 62 by the low pressure chemical vapor deposition technique described above. A masking layer 66 of a photoresist is then formed on the silicon nitride layer 64 over the area of the polysilicon layer 60 which is to form the island 44 using standard photolithographic techniques. The exposed area of the silicon nitride layer 64 is then removed using a standard plasma etching process.

Figure 11:
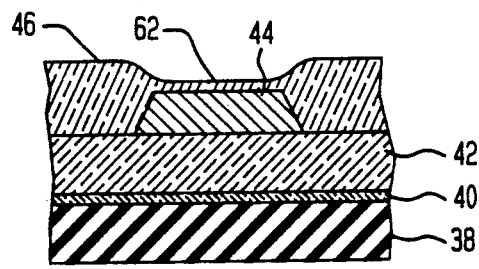
Figure 5:
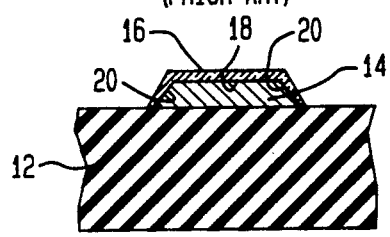

The portion of the polysilicon layer 60 not covered by the silicon nitride layer 64 is then oxidized by placing the device in a diffusion tube and heating it to about 800° C. with oxygen and/or steam flowing thereacross. This oxidation is carried out until the polysilicon layer 60 is converted to silicon dioxide completely through its thickness. The time required to completely oxidize the polysilicon layer 60 is much greater than would be predicted from standard oxidation tables. For a polysilicon layer 200 nanometers in thickness oxidized in the manner described above in water vapor, it takes about 30 to 36 hours to complete the oxidation. As shown in FIG. 11, this forms the insulating layer 46 completely around the polysilicon island 44. The silicon nitride layer 64 is then removed with a suitable etchant. The silicon dioxide layer 62 is not removed and will form a part of the gate insulator 50.

Figure 12:
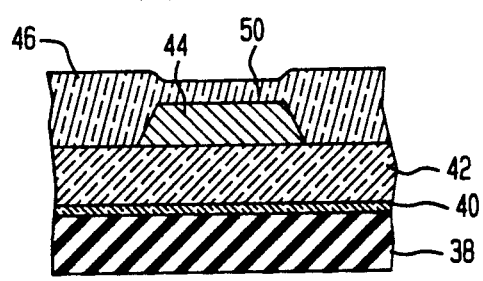
Figure 6:
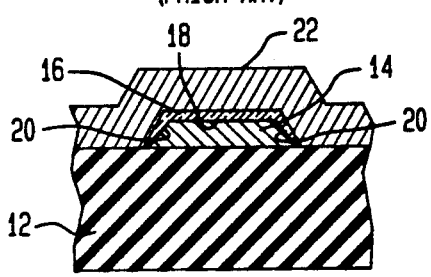
Figure 13:
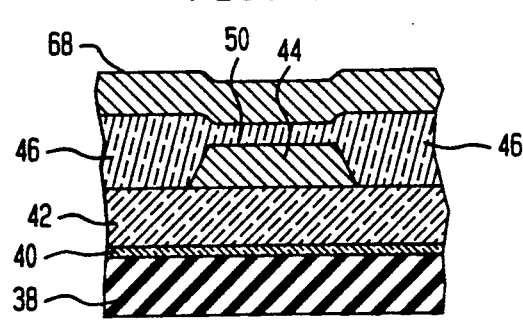

The device is then placed again in an oxidizing environment of oxygen and/or steam at approximately 800° C. to grow an additional layer of silicon dioxide of about 40 nanometers in thickness on top of the silicon dioxide layer 62 so as to form the gate insulator 50 as shown in FIG. 12. As shown in FIG. 13, a layer 68 of polysilicon is then deposited over the insulating layer 46 and the gate insulator 50 using the low pressure chemical vapor deposition process previously described. The polysilicon layer 68 is then defined using standard photolithographic techniques to form the gate 52. Subsequent device processing, such as doping (e.g., by ion implantation) the gate, source and drain regions, and forming the contacts 54, 56 and 58 are performed in the standard manner to complete the transistor 34.

Figure 1:
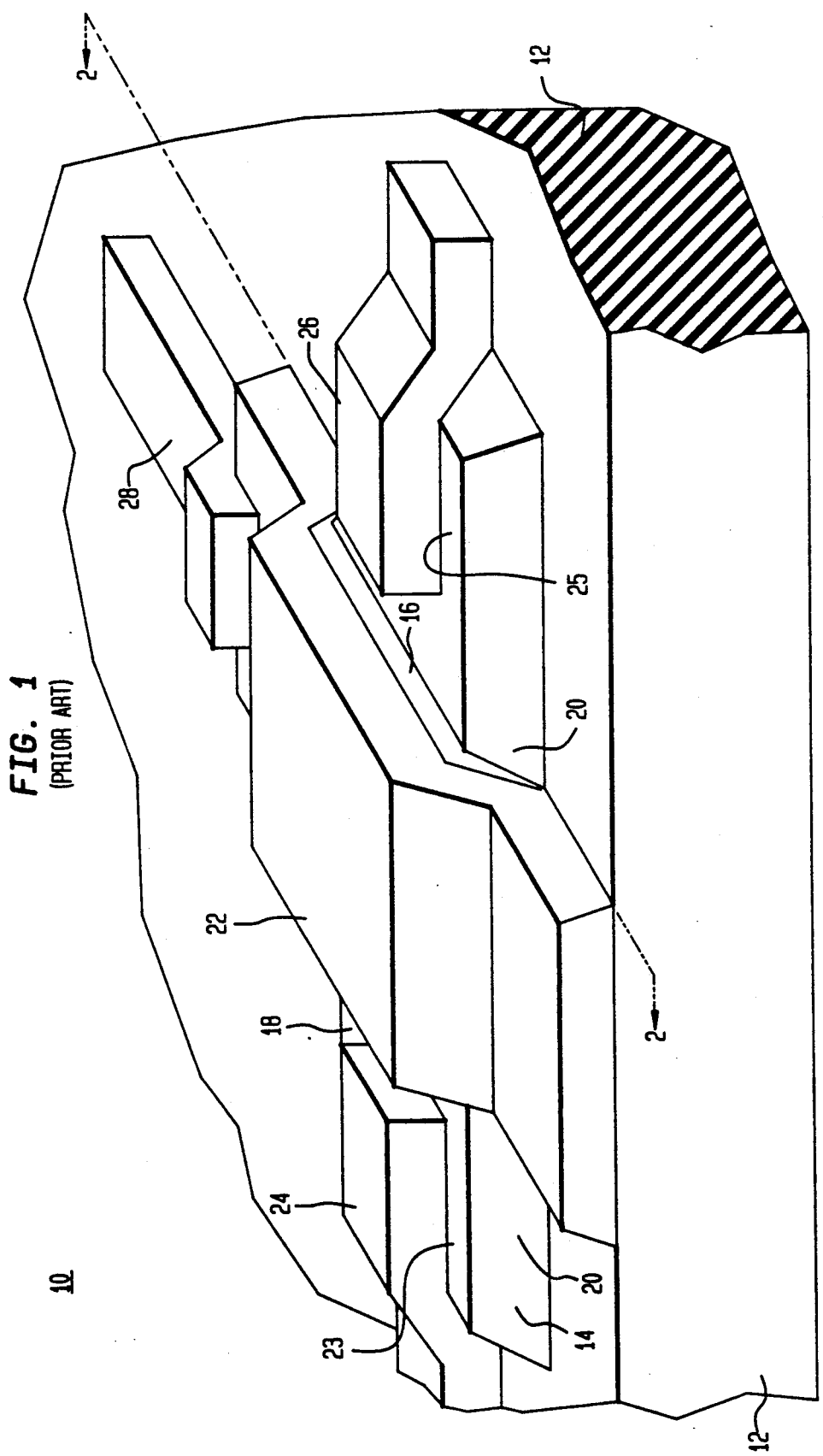
FIG. 1 is a perspective view of a typical prior art thin film field effect transistor.
Figure 2:
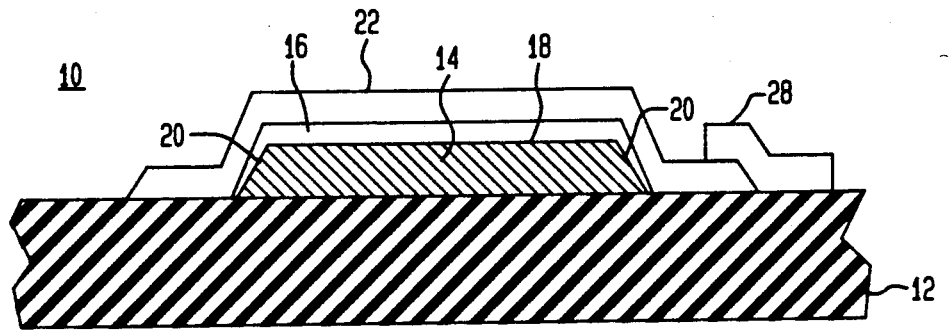
FIG. 2 is a sectional view taken along line 2—2 of FIG. 1.

Thus, it is seen that the method of the present invention forms a thin film field effect transistor 34 in which none of the silicon dioxide around the periphery of the polysilicon island 44, including the gate insulator 50, is thinner. The insulating layer 46 around the polysilicon island 44 is of substantially uniform thickness. Also, the gate insulator 50 is of substantially uniform thickness with the end regions being slightly thicker. The advantage obtained by this is that the breakdown voltage and electric field for the thin film field effect transistor 34 of the present invention is increased over that of the conventional thin film field effect transistor 10 shown in FIG. 1. This can be seen from the diagrams shown in FIGS. 14-17 in which the gate oxide current through the gate insulator 50 is plotted with respect to the gate voltage, with the source 51 and drain 53 contacts being grounded, for eight individual transistors.

Figure 14:
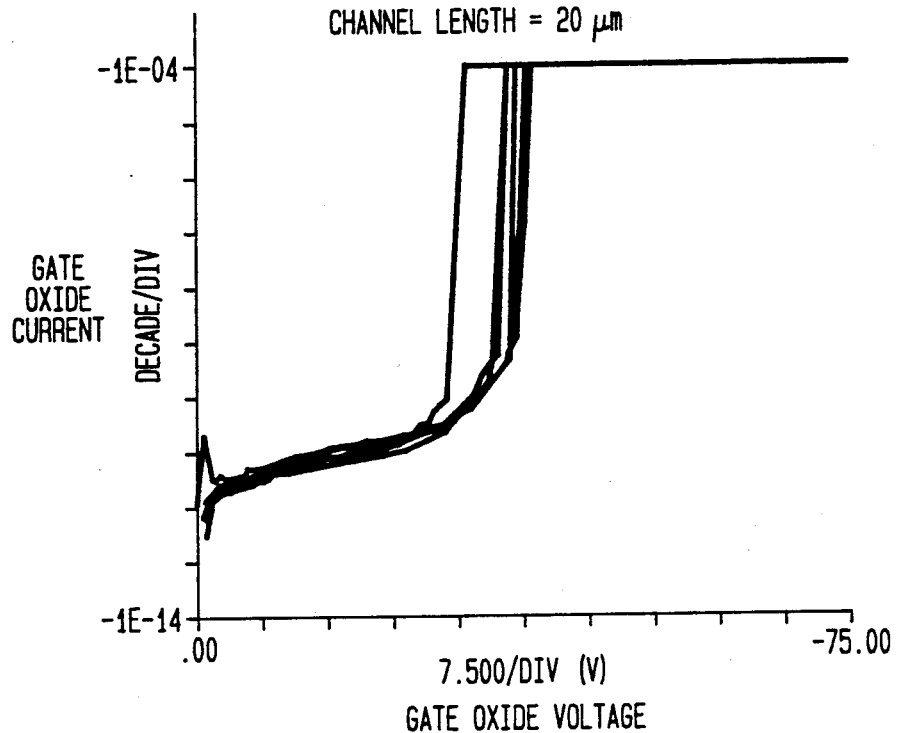
FIG. 14 is a diagram plotting the gate current vs. the gate voltage for a group of conventional thin film field effect transistors having a channel length of 20 micrometers.
Figure 15:
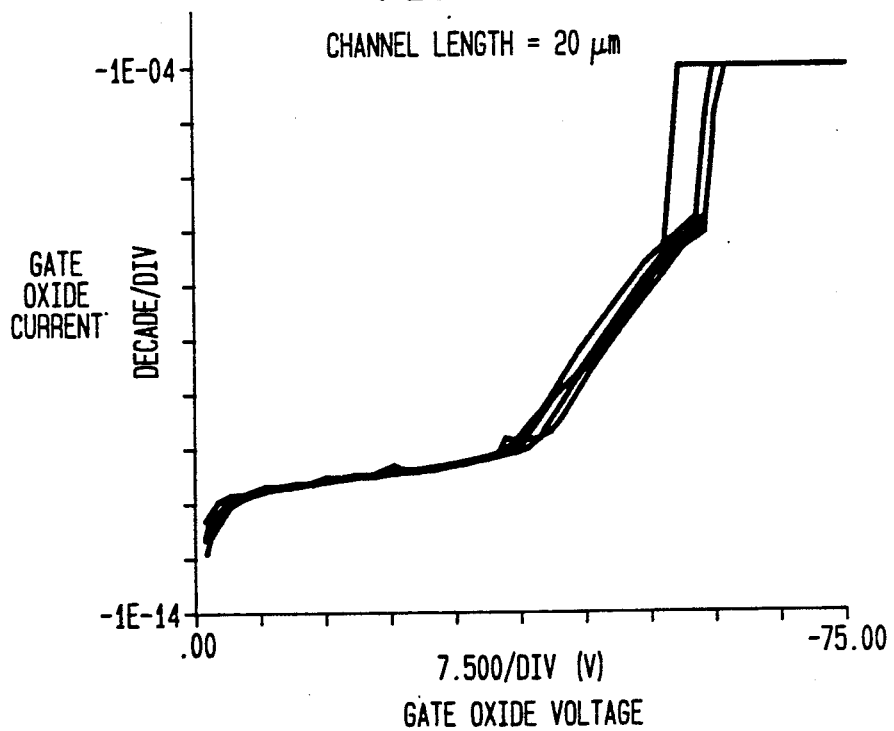
FIG. 15 is a diagram similar to that shown in FIG. 14 for a group of thin film field effect transistors having a channel length of 20 micrometers and being in accordance with the present invention.
Figure 16:
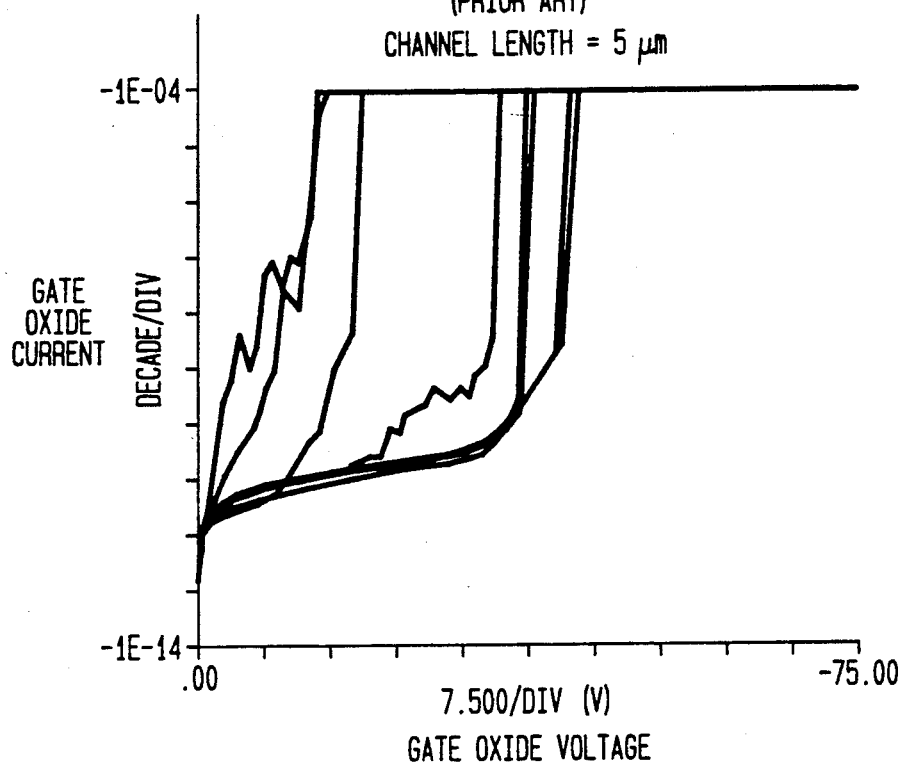
FIGS. 16 and 17 are diagrams similar to those shown in FIGS. 14 and 15 for field effect transistors having a channel length of 5 micrometers.
Figure 17:
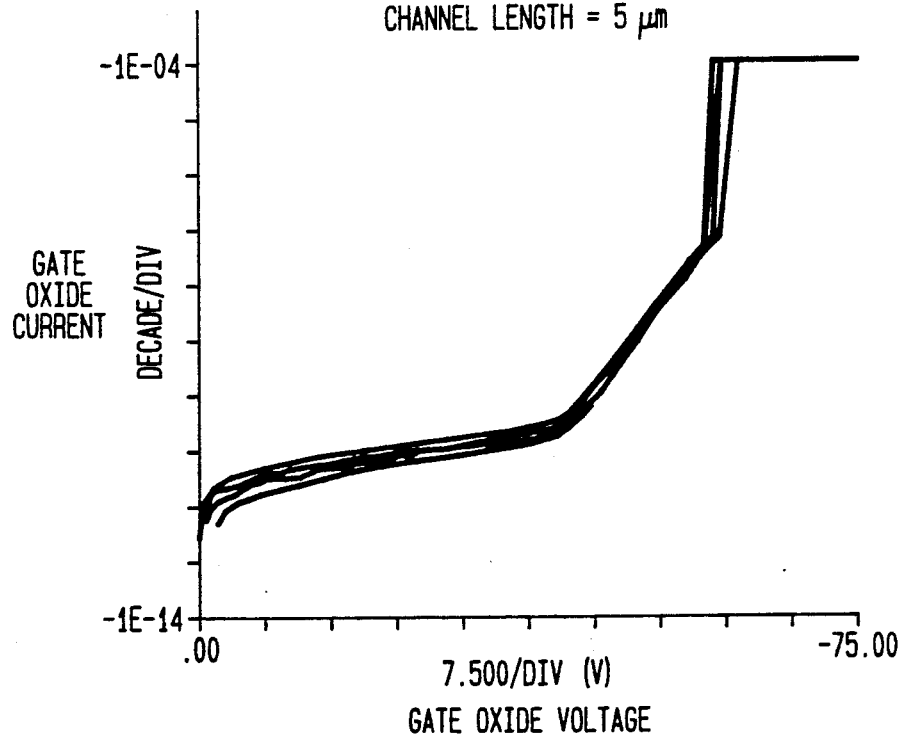

FIGS. 14 and 15 compare the results for a conventional transistor 10 (FIG. 1) with the results of the transistor 34 (FIG. 7) of the present invention in which the channel widths are 20 micrometers and the channel lengths are 20 micrometers. FIG. 14 shows that the standard transistors 10 have a breakdown voltage of about 37V, corresponding to a breakdown electric field of $7.1 \times 10^6$ volts/cm., whereas FIG. 15 shows that the transistors 34 of the present invention have a breakdown voltage of 57V, which corresponds to a breakdown electric field of $1.1 \times 10^7$ volts/cm. FIGS. 16 and 17 compare the results for transistors having a channel length of about 5 micrometers. FIG. 16 shows that conventional transistors 10 have a breakdown voltage of from 14 to 40 volts, whereas FIG. 17 shows that the transistors 34 of the present invention have a breakdown voltage of about 60 volts. Thus, the improvement in the breakdown voltage increases as the channel length is decreased.

Thus, there is provided by the present invention a thin film field effect transistor in which there is no decrease in the thickness of the silicon oxide layers at the edge of the polysilicon island so as to improve the breakdown voltage and other related characteristics of the transistor. There is also provided by the present invention a method of making the thin film field effect transistor.

It is to be appreciated and understood that the specific embodiments of the invention are merely illustrative of the general principles of the invention. Various modifications may be made consistent with the principles set forth. For example, it should be understood that the thicknesses of the various layers described above are only suggestive and may be varied. Also, the specific methods of deposition of the several films described above are suggestive and may be varied by using any well-known technique for depositing the particular material for each layer.

Although the polysilicon layer has been described as being converted to the silicon dioxide insulating layer by thermal oxidation, other techniques can be used. For example, plasma enhanced anodization of the polysilicon can be used. Plasma oxidation enables the oxidation process to be carried out at significantly lower temperatures than thermal oxidation, specifically in the range of 500°-600° C., which allows the use of substrates which cannot withstand the higher temperatures. Another oxidation process which can be used is the impingement of large numbers of oxygen ions into the polysilicon using standard ion implantation techniques. For sufficiently high ion doses, on the order of $1 \times 10^{16}$ cm$^{-2}$ through $5 \times 10^{18}$ cm$^{-2}$, the polysilicon can be converted to silicon dioxide. This may require a thermal anneal at elevated temperatures from 600° through 1000° C. In this case, the thickness of, and composition of, the masking film which serves to define the extent of the polysilicon island may have to be modified, particularly in thickness, to prevent impingement of the incident ions into the masked region. Instead of using oxygen ions, nitrogen ions may be used to form an insulating layer of silicon nitride.

The embodiments of the invention in which an exclusive property or privilege is claimed are defined as follows:

1. A method of making a thin film field effect transistor on a substrate comprising the steps of:
   forming a layer of polysilicon on a surface of said substrate;
   forming a first layer of silicon dioxide over said polysilicon;
   forming a mask of silicon nitride over said polysilicon layer;
   oxidizing the portion of the polysilicon layer around the periphery of the mask completely through its thickness so as to form an island of polysilicon completely surrounded by silicon dioxide;
   removing said silicon nitride without removing said first layer of silicon dioxide over said island of polysilicon;

forming a second layer of silicon dioxide by oxidizing a portion of said island of polysilicon;

forming a conductive gate over said first and second layers of silicon dioxide and across a portion of the top surface of the island, and forming source and drain regions in said polysilicon.

2. A method as set forth in claim 1 wherein said steps of oxidizing are performed at about 800 degrees C.

3. A method as set forth in claim 1 wherein said substrate comprises glass.

4. A method of making a semiconductor device to improve the gate oxide breakdown voltage of said device comprising the steps of:

forming a layer of polysilicon on a substrate;

forming a first layer of silicon dioxide over said polysilicon;

forming a mask of silicon nitride over polysilicon;

oxidizing the portion of the polysilicon around the periphery of said mask completely through its thickness to form an island of polysilicon;

removing said mask of silicon nitride without removing said first layer of silicon dioxide;

forming a second layer of silicon dioxide by oxidizing a portion of said island of polysilicon so that said first and second layers of silicon dioxide form an insulating gate of substantially uniform thickness over said island;

forming a conductive gate over said insulating layer and across a portion of said island; and forming source and drain regions in said polysilicon.

5. A method as set forth in claim 4 wherein said steps of oxidizing are performed at about 800 degrees C.

6. A method as set forth in claim 5 wherein said substrate comprises glass.

7. A low temperature method of making a semiconductor device comprising the steps of:

forming a layer of polysilicon on a substrate;

compensating for the low temperature stress-induced thin silicon dioxide regions formed during oxidation of polysilicon at temperatures ranging from about 500 to about 800 degrees C. comprising the steps of forming a first layer of silicon dioxide over a portion of the polysilicon;

forming a mask over said polysilicon;

oxidizing at a temperature ranging from about 500 to about 800 degrees C. the portion of the polysilicon around the periphery of said mask completely through its thickness to form an island of polysilicon;

removing said mask without removing said first layer of silicon dioxide;

forming a second layer of silicon dioxide by oxidizing a portion of said island at a temperature ranging from about 500 to about 800 degrees C.;

forming a conductive gate over said first and second layers of silicon dioxide and across a portion of said island; and forming source and drain regions in said island.

8. A method as set forth in claim 7 wherein said steps of oxidizing are performed at about 800 degrees C.

9. A method as set forth in claim 7 wherein said substrate comprises glass.

10. A method of making a thin film field effect transistor on a substrate comprising the steps of:

forming a layer of polysilicon on a surface of said substrate;

forming a first layer of silicon dioxide over said polysilicon;

forming a mask of silicon nitride over a portion of said polysilicon layer;

oxidizing the portion of the polysilicon layer around the periphery of the mask completely through its thickness so as to form an island of polysilicon surrounded by silicon dioxide;

removing said silicon nitride without removing said first layer of silicon dioxide;

forming a second layer of silicon dioxide by oxidizing a portion of said island at a temperature ranging from about 500 degrees C. to about 800 degrees C. so that said first and second layer of silicon dioxide form an insulating gate of uniform thickness over said island of polysilicon;

forming a conductive gate over said first and second layers of silicon dioxide and across a portion of the top surface of the island, and forming source and drain regions in said polysilicon.

11. A method as set forth in claim 10 wherein said step of forming a second layer of silicon dioxide is by oxidizing at about 800 degrees C.

12. A method of making a thin film field effect transistor on a substrate comprising the steps of:

forming a layer of polysilicon on a surface of said substrate;

forming a first layer of silicon dioxide over said polysilicon;

forming a mask of silicon nitride over a portion of said polysilicon layer;

oxidizing the portion of the polysilicon layer around the periphery of the mask completely through its thickness so as to form an island of polysilicon surrounded by silicon dioxide;

removing said silicon nitride without removing said first layer of silicon dioxide;

forming a second layer of silicon dioxide by plasma oxidizing a portion of said island at a temperature ranging from about 500 to about 600 degrees C.;

forming a conductive gate over said first and second layers of silicon dioxide and across a portion of the top surface of the island, and forming source and drain regions in said polysilicon.

* * * * *